United States Patent [19]

Kousai et al.

[11] Patent Number: 5,795,795
[45] Date of Patent: Aug. 18, 1998

[54] METHOD OF PROCESSING SEMICONDUCTOR DEVICE WITH LASER

[75] Inventors: Takamasa Kousai, Ohsaka; Hongyong Zhang; Akiharu Miyanaga, both of Kanagawa, all of Japan

[73] Assignee: Semiconductor Energy Laboratory Co., Ltd., Kanagawa, Japan

[21] Appl. No.: 462,361

[22] Filed: Jun. 5, 1995

[30] Foreign Application Priority Data

Nov. 18, 1994 [JP] Japan ................. 6-309826

[51] Int. Cl.$^6$ ............................ H01L 21/306
[52] U.S. Cl. ............ 437/174; 437/173; 117/94; 117/106
[58] Field of Search ............. 117/4, 7, 94, 106, 117/900, 904; 427/8; 437/173, 174

[56] References Cited

U.S. PATENT DOCUMENTS

| | | | |
|---|---|---|---|
| 4,266,986 | 5/1981 | Benton et al. ................. | 148/1.5 |
| 4,942,058 | 7/1990 | Sano ............................ | 427/431 |
| 5,352,291 | 10/1994 | Zhang et al. ................... | 117/8 |
| 5,372,836 | 12/1994 | Imahashi et al. ................ | 427/8 |
| 5,424,244 | 6/1995 | Zhang et al. ................... | 437/173 |

Primary Examiner—Felisa Garrett
Attorney, Agent, or Firm—Sixbey, Friedman, Leedom & Ferguson; Gerald J. Ferguson, Jr.; Jeffrey L. Costellia

[57] ABSTRACT

A method of fabricating a semiconductor device by the use of laser crystallization steps is provided. During these crystallization steps, an amorphous or polycrystalline semiconductor is crystallized by laser irradiation in such a way that generation of ridges is suppressed. Two separate laser crystallization steps are carried out. First, a laser irradiation step is performed in a vacuum, using somewhat weak laser light. Then, another laser irradiation step is performed in a vacuum, in the atmosphere, or in an oxygen ambient with intenser laser light. The first laser irradiation conducted in a vacuum does not result in satisfactory crystallization. However, this irradiation can suppress generation of ridges. The second laser irradiation step is performed in a vacuum, in the atmosphere, or in an oxygen ambient to achieve sufficient crystallization, but no ridges are produced.

19 Claims, 5 Drawing Sheets

METHOD OF PROCESSING SEMICONDUCTOR DEVICE WITH LASER

INDUSTRIAL FIELD OF UTILIZATION

The present invention relates to laser light-irradiating step (so-called laser annealing) in fabrication of semiconductor devices. Especially, the invention relates to a method of improving the crystallinity of a semiconductor material which consists totally or partially of an amorphous component or which is a substantially intrinsic polycrystalline semiconductor material, by irradiating the material with laser light.

PRIOR ART TECHNIQUES

In recent years, researches have been earnestly conducted on lower-temperature semiconductor device processes mainly because it is necessary to form semiconductor devices on insulating substrates as made of glass. Furthermore, there is a demand for miniaturization of devices. In addition, there are demands involved in multi-level devices.

In semiconductor processes, it may be necessary to crystallize either amorphous components contained in semiconductor materials or amorphous semiconductor materials. Also, it may be necessary to recover the crystallinity of semiconductor materials deteriorated by ion bombardment. Moreover, it may be necessary to further enhance crystallinity of crystalline materials. For these purposes, laser light-irradiation techniques (also known as laser annealing) have been proposed. With respect to laser light irradiation, two major methods have been proposed.

The first method uses a CW laser such as an argon ion laser. This method consists of irradiating a semiconductor material with a beam in the form of a spot. In particular, energy distribution variations inside the beam and movement of the beam are utilized. The semiconductor material is molten. Then, it is slowly solidified. In this way, the semiconductor material is crystallized.

This method has the problem that the throughput is low, because laser light in the form of a spot is scanned at a speed adapted for crystal growth.

The second method uses a pulsed laser such as an excimer laser. In this method, a semiconductor material is irradiated with a large-area, high-energy pulsed laser radiation to momentarily melt the material. Then, the material is solidified. In this way, the semiconductor material is crystallized. This method has excellent throughput, because the laser beam spot is large. Excimer lasers used in this method include a KrF excimer laser producing a wavelength of 248 nm, an XeCl excimer laser producing a wavelength of 308 nm, an XeF excimer laser producing a wavelength of 353 nm, and an ArF excimer laser producing a wavelength of 193 nm. These lasers produce pulses of high energies. Furthermore, the efficiency at which the supplied electric power is converted into laser light is high.

Problems to be Solved by the Invention

However, melting and solidification processes due to pulsed laser light occur everywhere within the laser beam spot. Therefore, the crystal growth has no directionality, and crystal grain boundaries are generated at random. Strains between crystals result in irregular protrusions of the film which are also known as ridges. The unevenness reaches 0.5 to 2 times the film thickness. This phenomenon is inevitable during laser irradiation using a pulsed laser. On the other hand, with a CW laser, strain relaxation occurs during melting and solidification processes and so sufficient space and time are afforded. Consequently, random film protrusions such as ridges have not been observed.

The degree of ridges depend much on the crystalline state of the semiconductor film. Especially, where a semiconductor layer crystallized by solid-phase epitaxy is irradiated with laser light, greater ridges tend to occur than in the case where an amorphous material is irradiated with laser light. This is related to the fact that the height of ridges (degree of unevenness) depends on the size of crystals. That is, if a film crystallized to some degree of size by solid-phase epitaxy is irradiated with laser light, then greater crystals are produced.

On the other hand, crystals obtained by irradiating amorphous films with laser light are smaller in size and so ridges become less uneven. If a polycrystalline silicon film crystallized by adding an element for promoting crystallization of amorphous silicon such as nickel is irradiated with laser light, then greater crystals are obtained. Therefore, greatly uneven ridges are produced.

Especially, if such ridges are produced on the surface of a semiconductor film located under the gate electrode of a gate-insulated device such as a TFT, then the electric field is concentrated in the protruding portions of the ridges. Also, the gate-insulating film at the ridge portions is thinned. In consequence, a leakage current is produced. Furthermore, a dielectric breakdown is likely to occur. As a result, the characteristics and the reliability of the thin-film transistor are deteriorated.

Means for Solving the Problems

The present invention has been made to solve these problems. In the present invention, two separate laser crystallization steps are performed. The energy density of the first laser irradiation step is set lower than the energy density of the second laser irradiation step. The first laser irradiation is effected in a vacuum lower than 100 Pa, preferably lower than 1 Pa. Thus, generation of ridges is suppressed. The second laser irradiation step may be carried out either in a vacuum or in air.

The present invention is characterized in that laser irradiation is done in a vacuum. It is known that ridges can be suppressed by providing this manufacturing step. Its mechanism is not understood. The energy densities of the first and second laser radiations vary, depending on the semiconductor material to be crystallized and on the used laser radiations. Preferably, the energy density of the second laser radiation is more than 1.3 times as high as the energy density of the first laser radiation. More preferably, the former energy density is more than 1.5 times as high as the latter energy density.

For example, where KrF excimer laser light having a wavelength of 248 nm is used for an amorphous silicon film, the energy density of the first laser irradiation is preferably 150 to 250 mJ/cm$^2$, and the energy density of the second laser irradiation is preferably 250 to 400 mJ/cm$^2$. Similar results can be obtained by using lasers other than KrF excimer lasers. For instance, where an XeCl excimer laser producing a wavelength of 308 nm is used to emit energy densities within substantially the same range, similar results are obtained. During the first and second laser irradiation steps, the substrate temperature is preferably from room temperature to 550° C., more preferably 150° to 550° C. Especially, as the substrate temperature is elevated, crystal defects tend to be alleviated.

The second laser irradiation may be carried out either in a vacuum or in an oxygen ambient. Where the productivity is taken into account, both laser irradiation steps are preferably carried out in a vacuum within the same chamber. Especially, within the vacuum chamber, the substrate can be easily heated. When the substrate is heated in an ambient at some pressure, the effect of convection of gas must be taken into consideration. Where the substrate is heated above 350° C. in an ambient at more than 100 Pa, this situation is equivalent to the case in which the whole chamber is heated. Hence, the system is bulky.

On the other hand, where it is carried out in air or in an oxygen ambient, merits are obtained. In this case, many dangling bonds existing at crystal grain boundaries are terminated. As a result, a semiconductor material which exhibits improved characteristics even under a high electric field and does not easily deteriorate is obtained. If such a semiconductor material is used for a gate-insulated device such as a thin-film transistor, the material contributes to improvements of characteristics and reliability.

Where the second laser irradiation step is effected in air or in an oxygen ambient, if the same chamber is used, the substrate temperature is varied by introduction of gases after the first laser irradiation step. The system must wait until the substrate temperature returns to the preset value. It is necessary to improve the productivity in this respect. This point can be solved by using a laser annealing system equipped with a multi-chamber system shown in FIG. 4(A).

The multi-chamber system shown in FIG. 4(A) has a chamber used only for a vacuum and a chamber used only for $O_2$. A substrate placed in position by a take in/out chamber is moved by an automatic transport system within this multi-chamber system. First, the substrate is shifted into a preliminary chamber, which is then evacuated. Then, the substrate is moved into a chamber 1. In the chamber 1, the first laser irradiation is effected. The substrate is again transported into the preliminary chamber, which is loaded with oxygen at appropriate pressure. Then, the substrate is moved into a chamber 2, which is maintained as an oxygen ambient. In the chamber 2, the second laser irradiation is carried out. Thereafter, the substrate is returned to the take in/out chamber via the preliminary chamber. Thus, a series of laser irradiation steps is completed. The description made thus far relates to movement of a single substrate. If substrates are always set in the preliminary chamber and in the chambers 1 and 2, the waiting time can be saved. Also, the productivity can be enhanced.

Since the series of operations is carried out within the chamber in this way, the evacuation work is performed, in principle, only in the preliminary chamber. The substrate temperatures used in the first and second laser irradiation steps, respectively, can be set separately, by using the two chambers in this way. For example, the first laser irradiation can be performed at a substrate temperature of 550° C., and the second laser irradiation can be effected at a substrate temperature of 200° C. Since the first laser irradiation is conducted within a vacuum, it is easy to elevate the temperature of the substrate to 350° C. or more. If one attempts to set the temperatures used for the first and second steps as described above with the same chamber, considerable time is required until the substrate temperature stabilizes. Hence, the productivity decreases.

With respect to the laser light source, two independent lasers and optics (apparatus for converting laser light of a Gaussian distribution into a rectangular form or other requisite distribution) can be exploited. However, as shown in FIG. 4(a), laser beam emitted by one laser may be divided into two by a beam splitter. These two beams may be introduced into the chamber through their respective optics. In this case, the investment in the laser installation can be halved. Since the energy of the first laser irradiation is smaller than the energy of the second laser irradiation, the beam is divided, taking account of this fact. That is, the energy of the laser light introduced into the optics 1 is smaller than that of the laser light introduced into the optics 2.

In the present invention, the shape of the beam of the laser light can be a square. However, if higher productivity is sought, the light may be shaped into a linear beam longer than one side of the substrate. In particular, in the case of a square beam, when the substrate is scanned, it is necessary to move it vertically and horizontally in two dimensions. Therefore, the mechanism used for such movements is made complex. Also, it takes a long time to make such movements. Normally, it is difficult to move the laser light source and so it is common practice to move the substrate. Where a square beam is employed, if the whole surface of the substrate is irradiated with laser light as shown in FIG. 4(B), an area about 4 times as large as the area of the substrate is needed. Consequently, the volume of the chamber is increased.

However, if a slender linear beam is used, it is only necessary to move the substrate in one dimension. The mechanism used for this purpose is also simple. In order to irradiate the whole surface of the substrate, an area about twice as large as the area of the substrate suffices, as shown in FIG. 4(C). Especially, the volume of the chamber can be half the volume shown in FIG. 6(B).

Where a linear beam is used, if the first and second laser beams are emitted from the first directions, island-like nonuniformities tend to occur in one direction. A good-quality semiconductor material of less film quality nonuniformity is obtained by causing the substrate to make a substantially quarter revolution, i.e., the first laser light is substantially perpendicular to the second laser light.

A crystalline semiconductor material obtained according to the present invention has less ridges on the film surface. This is useful for the active layer of thin-film transistors (TFTS) in which the state of the interface with the gate-insulating film is of importance. With respect to TFTs having gate-insulating films as thin as about 300 to 1200 Å, ridges are comparable to the gate-insulating films. The gate leakage results in conspicuous production yield decreases and characteristic deterioration. The invention makes it possible to suppress the ridges. These problems can be solved greatly.

EXAMPLE

Example 1

FIG. 3 shows a conceptual diagram of a laser annealing system used in the present example. Laser light is generated by an oscillator 32. The light is passed through totally reflecting mirrors 35 and 36 and amplified by an amplifier 33. The light is then passed through totally reflecting mirrors 37 and 38 and introduced into optics 34. Up to this point, the beam of the laser light is a rectangle measuring about 30×90 $mm^2$. This is shaped by the optics 34 into a long beam having a length of 100 to 300 mm and a width of 1 to 3 mm. The maximum energy of the laser light passed through the optics is 3 J/shot. To enable laser irradiation in a vacuum or in an ambient of a gas such as oxygen, the stage and driver 40 for the sample are installed in a chamber 42. To permit the laser light to enter the chamber 42 from outside, the whole chamber is made from quartz to prevent absorption of the laser light. Alternatively, the portion of the chamber which introduces the laser light is made from quartz. A vacuum pumping system and an oxygen introduction system (none of which are shown) are connected.

The laser processing throughput has been improved dramatically by using the beam shaped into such a slender form.

That is, after going out of the optics 34, the strip-like beam hits a specimen 41 via a totally reflecting mirror 39. Since the width of the beam is substantially on the same order as the width of the specimen or longer than the latter width, the specimen is eventually required to be moved in one direction. Accordingly, the stage and driver 40 for the specimen are simple in structure and can be easily serviced. Furthermore, when the specimen is placed in position, alignment operations can be easily performed. It is to be noted that these devices are required to be mounted on a stable pedestal 31 such as a vibration-proof base.

The above-described laser system can be built as a unit. It may also be combined with other machines such as plasma-assisted CVD film deposition machine, ion implanter (or ion doping machine), thermal annealing machine, and other semiconductor fabrication machines to construct a multi-chamber system.

In the present example, the case in which thin-film transistors are formed on an insulating substrate as made from glass is described. Generally, low-temperature processes for fabricating thin-film transistors are roughly as follows.

[1] Formation of a silicon oxide film acting as a buffer film and of an amorphous silicon film over a glass substrate, and/or application of crystallization-promoting agent such as nickel acetate to the amorphous silicon film.

[2] Crystallization of the amorphous silicon film by solid-phase epitaxy.

[3] Laser processing of the crystallized silicon film to improve the crystallinity.

[4] The silicon film is etched into islands of the silicon region.

[5] Formation of a gate-insulating film (silicon oxide).

[6] Formation of gate electrodes.

[7] Impurity elements such as phosphorus and boron are implanted to form source/drain regions.

[8] The implanted impurities are activated by laser irradiation.

[9] Formation of an interlayer insulator.

[10] Formation of electrodes on the source/drain regions.

The present example and the following Examples 2, 3, and 4 relate to [3] laser irradiation conducted to further enhance the crystallinity of a polycrystalline silicon film in the above-described manufacturing steps.

FIG. 1 illustrates the laser processing steps of the present example. In the present example, an amorphous silicon film was allowed to stand for 24 hours in a 600° C.-ambient to crystallize the polycrystalline silicon film.

As shown in FIG. 1(A), a laser beam 11 is sufficiently large to illuminate one side of a substrate 12 (150 mm×200 mm). For example, the beam is a linear form having a width of 1 mm and a length of 300 mm. As the laser, a KrF excimer laser producing a wavelength of 248 nm was used. The repetition frequency of the laser was 100 Hz. The energy density of the laser light was 200 mJ/cm$^2$ (FIG. 1(A)).

First, the substrate was placed on a driver 40 within a chamber 42. The chamber 42 was evacuated to 1 Pa. The substrate was heated to 450° C. Under this condition, the first laser irradiation step was performed. As shown in FIG. 1(B), the substrate was moved in such a way that the laser light hit the substrate (FIG. 1(B)).

The substrate was moved while illuminating it with the laser light. At this time, the scanning speed of the laser light was set to 10 mm/s. The laser light was moved 10 mm per second. During this time interval, the laser produced 100 shots of pulses. It followed that the laser beam moved 0.1 mm per shot. Since the width of the beam was 1 mm, about 10 shots of the laser light were emitted per location. The laser was scanned down to the lower end of the substrate in this way. The whole substrate was illuminated with the laser light (FIG. 1(C)).

Subsequently, the second laser irradiation step was carried out. In this step, the substrate temperature was set to 200° C. and then atmosphere was introduced into the chamber 42. This step was performed within the atmosphere. The sequence of these steps was the same as the sequence of the steps of the first process illustrated in FIG. 1, (A)–(C).

AS shown in FIG. 1(B), the substrate was moved in such a way that the laser light impinged on the substrate. At this time, the substrate temperature was set to 300° C. In the same way as the first process, a KrF excimer laser was used. The conditions were similar to the conditions of the first process except that the energy density was 300 mJ/cm$^2$.

Then, the substrate was moved while irradiating it with the laser light. At this time, the scanning speed of the laser light was set to 10 mm/s. In this way, the laser was scanned down to the lower end of the substrate. The whole substrate was irradiated with the laser light.

About $5\times10^6$ ridges/mm$^2$ were observed on a silicon film crystallized by laser irradiation only in the atmosphere as in the prior art techniques. In the present example, almost no ridges could be observed as a result of the manufacturing steps described above. As a result of the second laser irradiation conducted in the atmosphere, dangling bonds within the silicon film were buried by oxygen. Semiconductor devices fabricated, using this silicon film showed good characteristics. Highly reliable devices were obtained.

Example 2

Unlike Example 1, the present example relates to irradiating a crystalline silicon film which was subjected to a low-temperature, short-time, solid-phase epitaxy in step [2] with laser light. For this purpose, nickel was introduced to promote crystallization of an amorphous silicon film in step [1] of processes for fabricating thin-film transistors.

FIG. 1 illustrates the laser-processing steps of the present example. In the present example, as shown in FIG. 1(A), the laser beam 11 is sufficiently large to illuminate one side of the substrate 12 (150 mm×200 mm). For example, the beam is a linear form having a width of 2 mm and a length of 180 mm. As the laser, an XeCl excimer laser producing a wavelength of 308 nm was used. The repetition frequency of the laser was 100 Hz. The energy density of the laser light was 200 mJ/cm$^2$ (FIG. 1(A)).

First, the first laser irradiation was effected in a vacuum. In the same way as in Example 1, a substrate was mounted on a driver 40 within a chamber 42 shown in FIG. 3. The chamber 42 was evacuated to 0.1 Pa. The substrate was heated to 200° C. As shown in FIG. 1(B), the substrate was moved in such a way that the laser light hit the substrate (FIG. 1(B)).

The substrate was moved while illuminating it with the laser light. At this time, the scanning speed of the laser light was set to 10 mm/s. As a result, the laser beam was moved 0.1 mm per shot. Since the width of the beam was 2 mm, about 20 shots of the laser light were emitted per location. The laser was scanned down to the lower end of the substrate in this way. The whole substrate was illuminated with the laser light (FIG. 1(C)).

Thereafter, the second laser irradiation was performed in the same chamber. The substrate temperature was maintained at 200° C., and 1 atm. oxygen was introduced into the chamber 42.

In the same way as in the first process, an XeCl excimer laser was used. The conditions were similar to the conditions of the first process except that the energy density was 300 mJ/cm². The substrate was moved in such a way that the laser light hit the substrate (FIG. 1(B)).

The substrate was moved while illuminating it with the laser light. At this time, the scanning speed of the laser light was set to 10 mm/s. As a result, about 20 shots of laser light were emitted per location. The laser was scanned down to the lower end of the substrate in this way. The whole substrate was illuminated with the laser light (FIG. 1(C)).

A crystalline silicon film was obtained by the two steps described thus far. Where a crystalline silicon film which was subjected to solid-phase epitaxy by introducing nickel by the prior art techniques was crystallized by laser, especially numerous ridges occurred. About 1 to 5×10⁸ ridges were produced per mm². In the present example, however, almost no ridges were observed. During the laser irradiation within the atmosphere, dangling bonds within the silicon film were buried by oxygen and so semiconductor devices fabricated, using this silicon film, showed good characteristics.

Example 3

FIG. 2 illustrates the laser-processing steps of the present example. In the present example, the substrate is caused to make a quarter revolution during the first and second laser irradiation steps to further improve the uniformity of the film quality during laser crystallization subsequent to nickel-added solid-phase epitaxy, in the same way as in Example 2. The first beam is made substantially perpendicular to the second beam. Using a crystalline silicon film irradiated with laser light in this way, N-channel TFTs were fabricated. In the present example, a laser beam 21 is large enough to irradiate one side of the substrate 22 (100 mm×200 mm). For example, the beam is a linear form having a width of 1 mm and a length of 250 mm. As the laser, an XeF excimer laser producing a wavelength of 353 nm was used. The repetition frequency of the laser was 100 Hz. The energy density of the laser light was set to 150 mJ/cm² (FIG. 2(A)).

First, the substrate was placed within a vacuum chamber. The chamber was evacuated to 1 Pa. The substrate was heated to 550° C. Under this condition, the first laser irradiation step was performed. As shown in FIG. 2(B), the substrate was moved in such a way that the laser light hit the substrate (FIG. 2(B)).

The substrate was moved while illuminating it with the laser light. At this time, the scanning speed of the laser light was set to 10 mm/s. The laser was scanned down to the lower end of the substrate in this way. The whole substrate was illuminated with the laser light (FIG. 2(C)).

Then, 0.1 atm. oxygen was admitted into the chamber. The substrate temperature was lowered to 200° C. The substrate was caused to make a quarter revolution. The substrate was moved to permit the laser light to impinge on the substrate (FIG. 2(D)).

In the same way as in the first process, an XeF excimer laser was used. The conditions were similar to the conditions of the first process except that the energy density was 300 mJ/cm².

The substrate was moved while illuminating it with the laser light. At this time, the scanning speed of the laser light was set to 10 mm/s. The laser was scanned to the lower end of the substrate in this way. The whole substrate was illuminated with the laser light (FIG. 2(E)).

A crystalline silicon film was obtained by the two steps described thus far. The first laser irradiation step was carried out at a comparatively high temperature of 550° C. The substrate was caused to make a quarter revolution such that the beam of the first laser irradiation was substantially perpendicular to the beam of the second laser irradiation. Especially, generation of ridges can be suppressed better than in Example 2. A good-quality crystalline silicon film of less film quality nonuniformity could be obtained.

Steps for fabricating TFTs, using the crystalline silicon film, are hereinafter described with reference to FIG. 5. FIG. 5(A) shows the manner in which a crystalline silicon film 501 undergone the above-described laser processing steps are formed over a glass substrate and a buffer silicon oxide film (FIG. 5(A)).

Then, the silicon film 501 crystallized in this way was etched into islands of silicon film 502. This island-shaped silicon film 502 will form the active layer of TFTs later. A gate-insulating film 503 was formed on this silicon film. In this example, a silicon oxide film having a thickness of 500 to 1200 Å, e.g., 1000 Å, was formed by plasma-assisted CVD. In the past, when the gate-insulating film 503 was made thin in this way, thinned film portions or uneven portions were created by the effect of the ridges. An electric field concentration was produced. This caused a tunneling current or dielectric breakdown. Ridges were reduced by the use of the present invention. Therefore, such defects hardly occurred. The state of the interface between the active layer and the gate-insulating film affects the characteristics of the TFTS. However, almost no ridges existed and, therefore, excellent TFT characteristics were derived.

Then, an aluminum film (containing 1% by weight of Si or 0.1 to 0.3% by weight of Sc) having a thickness of 3000 Å to 3 µm, e.g., 6000 Å, was formed by a sputtering process. Subsequently, this aluminum film was etched to form gate electrodes 504 (FIG. 5(B)).

Using the gate electrodes as a mask, phosphorus was implanted as an impurity into the island-shaped silicon film by self-aligned ion doping techniques. Thus, N-type doped regions 504 were formed. The dose was 1×10¹⁴ to 8×10¹⁵ atoms/cm². The accelerating voltage was 60 to 90 kV. For example, the dose was 1×10¹⁵ atoms/cm². The accelerating voltage was 80 kV (FIG. 5(C)).

Then, the doped regions were irradiated with KrF excimer laser radiation having a wavelength of 248 nm and a pulse width of 20 nsec to activate the doped regions. At this time, the appropriate energy density was 250 to 300 mJ/cm².

As an interlayer insulating film 506, a silicon oxide film was formed to a thickness of 5000 Å by plasma-assisted CVD over the whole surface. The interlayer insulating film 506 and the gate-insulating film 503 were etched to form contact holes in the source/drain regions.

Then, the aluminum film of 3000 Å to 2 µm, e.g., 5000 Å was formed by a sputtering method. This aluminum film was etched to form source/drain electrodes 507. In this way, N-channel TFTs were fabricated (FIG. 5(D)).

Example 4

FIG. 2 illustrates the laser-processing steps of the present example. In the present example, the substrate is caused to make a quarter revolution during the first and second laser irradiation steps to further improve the uniformity of the film quality during laser crystallization subsequent to nickel-added solid-phase epitaxy, in the same way as in Example 3. Both first and second laser irradiation steps were carried out in a vacuum. In the present example, a laser beam 21 is large enough to irradiate one side of the substrate 22 (100 mm×200 mm). For example, the beam is a linear form having a width of 1 mm and a length of 250 mm. As the laser, a KrF excimer laser producing a wavelength of 248 nm was used. The repetition frequency of the laser was 10 Hz. The energy density of the laser light was set to 150 mJ/cm$^2$ (FIG. 2(A)).

First, the substrate was placed within a vacuum chamber. The substrate was heated to 550° C. As shown in FIG. 2(B), the substrate was moved in such a way that the laser light hit the substrate (FIG. 2(B)).

The substrate was moved while illuminating it with the laser light. At this time, the scanning speed of the laser light was set to 10 mm/s. The laser was scanned down to the lower end of the substrate in this way. The whole substrate was illuminated with the laser light (FIG. 2(C)).

Thereafter, the substrate was caused to make a quarter revolution. The substrate was moved so that the laser light hit the substrate. At this time, the substrate temperature was 550° C. (FIG. 2(D)).

In the same way as in the first process, a KrF excimer laser was used. The conditions were similar to the conditions of the first process except that the energy density was 280 mJ/cm$^2$. The whole substrate was irradiated with the laser light (FIG. 2(E)).

A crystalline silicon film was obtained by the two manufacturing steps described thus far. The two laser irradiation steps were carried out at a comparatively high temperature of 550° C. Therefore, relaxation of crystal grain boundaries was promoted. Ridges were reduced to a minimum. Furthermore, crystal defects at grain boundaries could be greatly reduced by the above-described laser irradiation at the above-described temperatures. The effects are comparable to the effects obtained by laser irradiation conducted in an oxygen ambient in Example 3. In Example 3, the inside of the chamber is maintained as an oxygen ambient. Therefore, the substrate temperature could not be elevated above 350° C. In the present example, since the inside was a vacuum, the substrate temperature could be elevated to 550° C.

Effects of the Invention

Ridges on the surface of a semiconductor film produced during laser-crystallization steps can be suppressed by laser irradiation techniques according to the present invention. Furthermore, the characteristics of semiconductor devices fabricated, using this semiconductor material, could be improved. In addition, the characteristics could be prevented from deteriorating.

Where a film is crystallized by laser radiation in accordance with the present invention after an amorphous material is crystallized by solid-phase epitaxy, ridges could be reduced greatly. In this way, the present invention is considered to be industrially advantageous.

LEGENDS

Figure 1A:
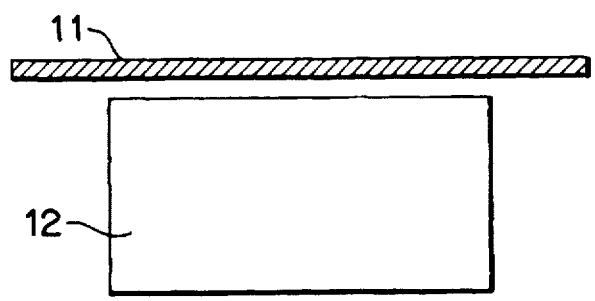
FIG. 1 is a diagram illustrating a laser-processing method of examples (Examples 1 and 2)
Figure 1B:
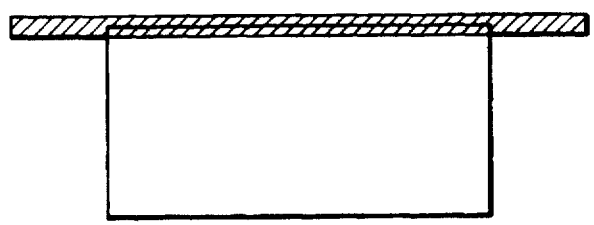
Figure 1C:
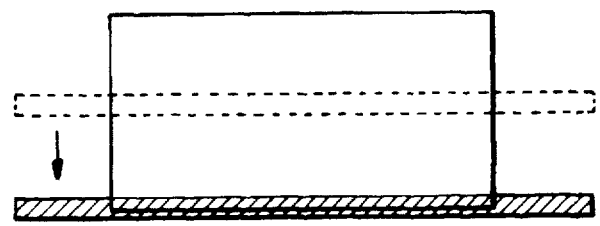
Figure 2A:
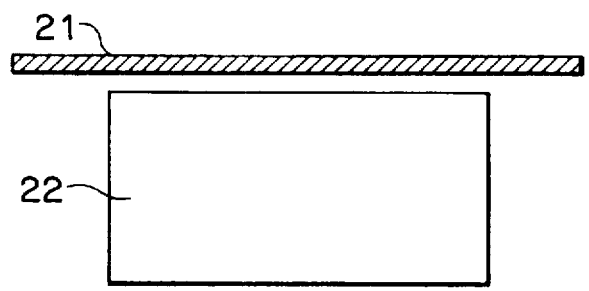
FIG. 2 is a diagram illustrating a laser-processing method of examples (Examples 3 and 4)
Figure 2B:
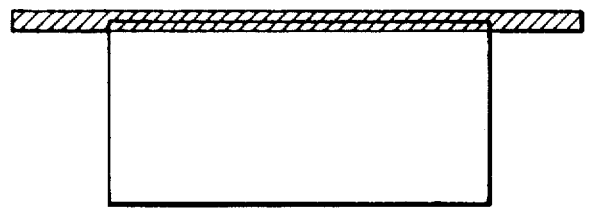
Figure 2C:
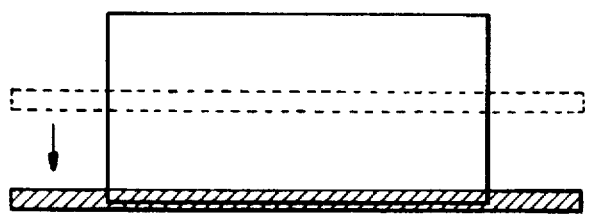
Figure 2D:
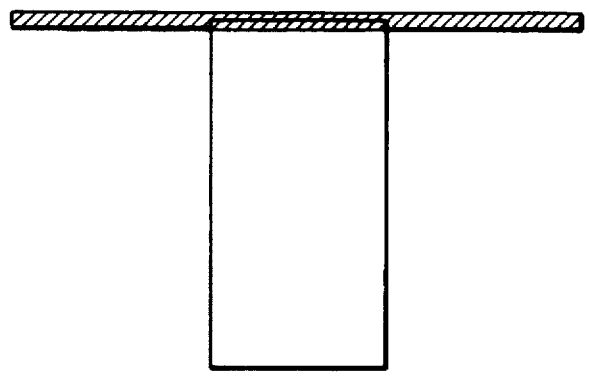
Figure 2E:
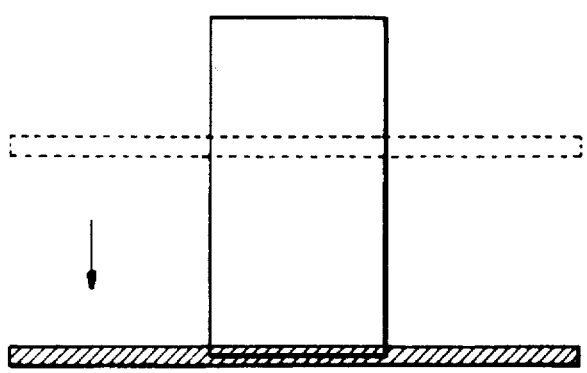
Figure 3:
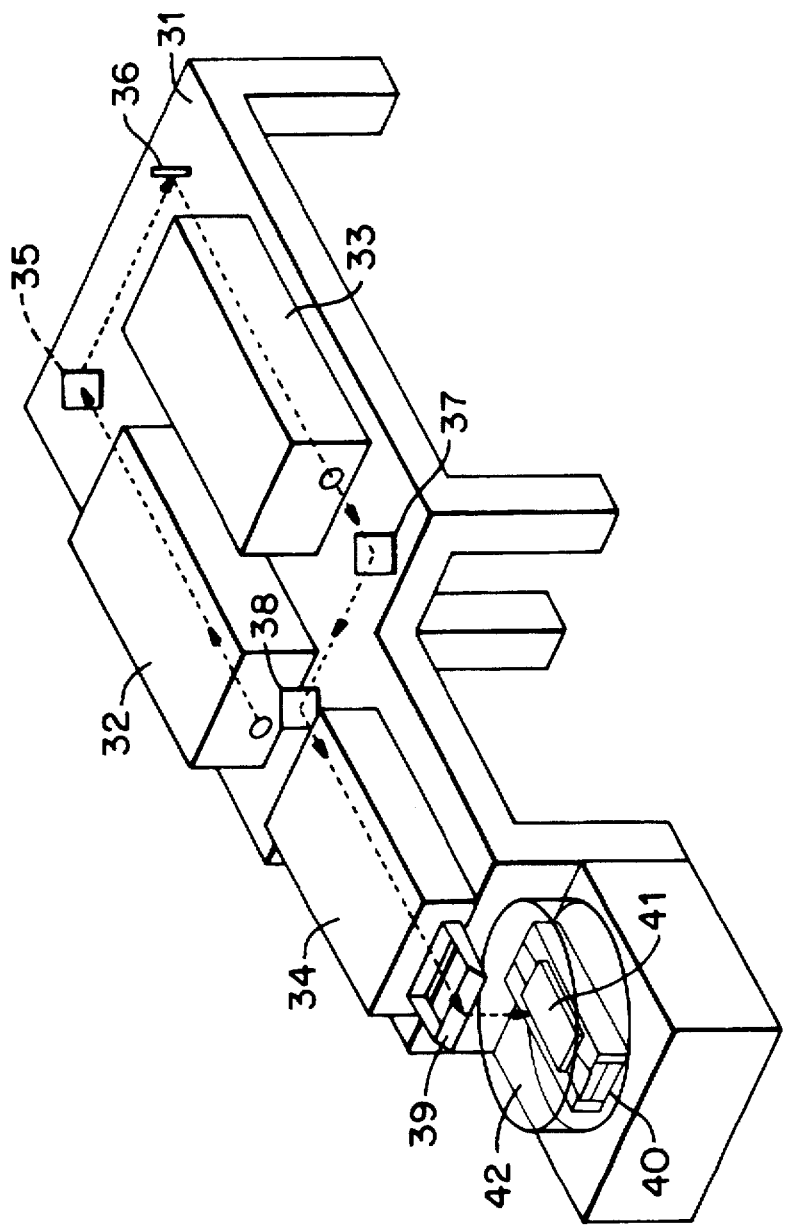
FIG. 3 is a conceptual diagram of a laser annealing system used in the examples.
Figure 4A:
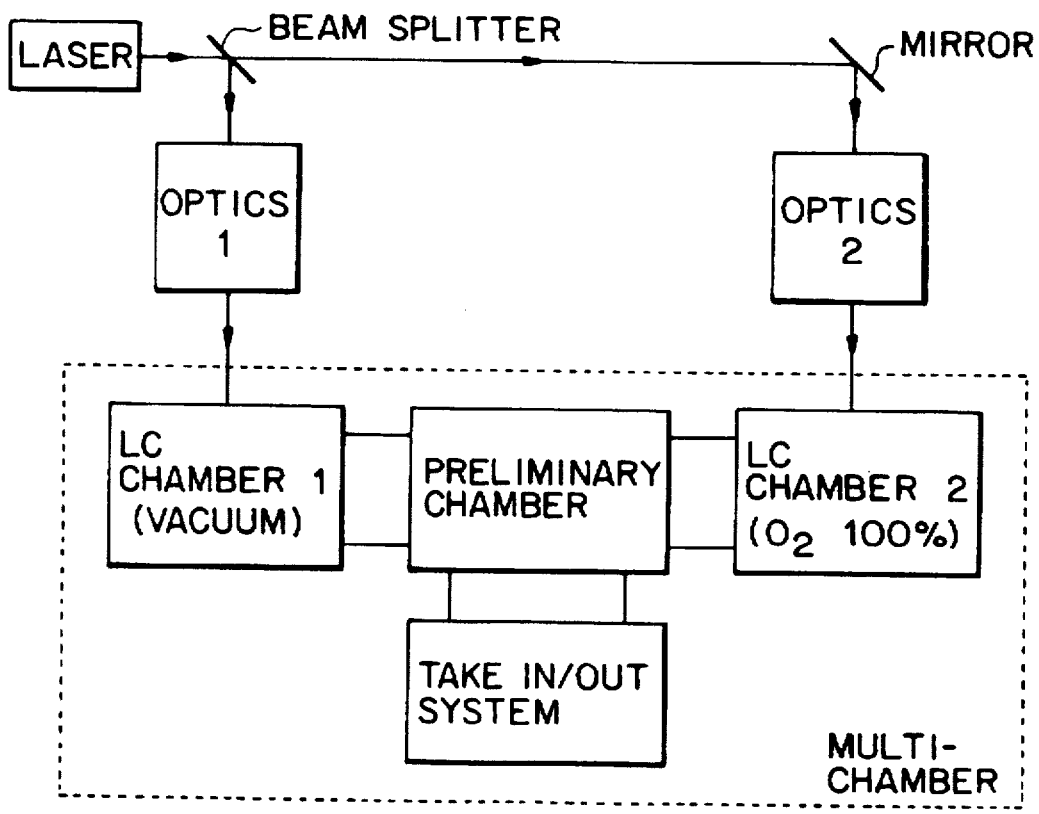
FIG. 4 is a conceptual diagram of a laser annealing system having a multi-chamber system.
Figure 4B:
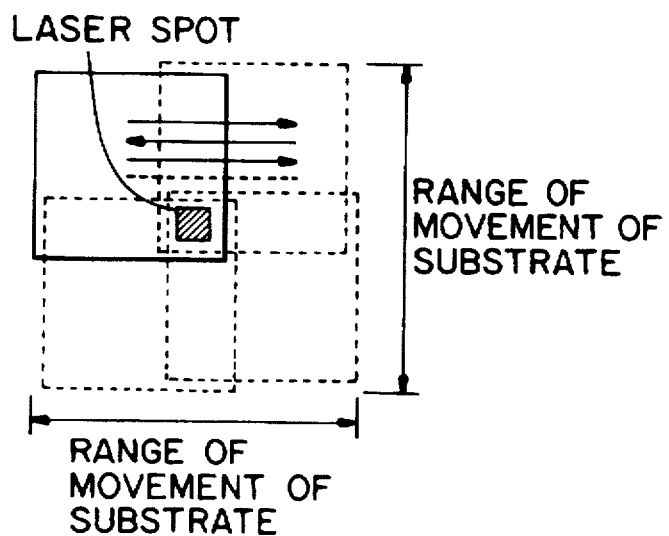
Figure 4C:
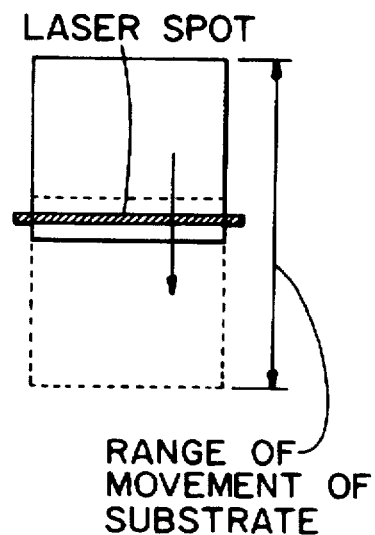
Figure 5A:
FIG. 5 is a diagram illustrating steps for fabricating TFTs in Example 3.
Figure 5B:
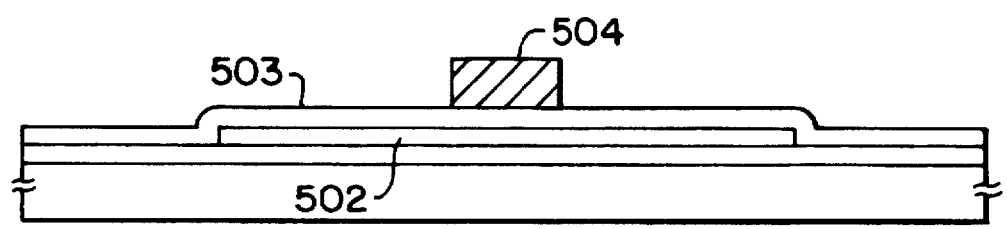
Figure 5C:
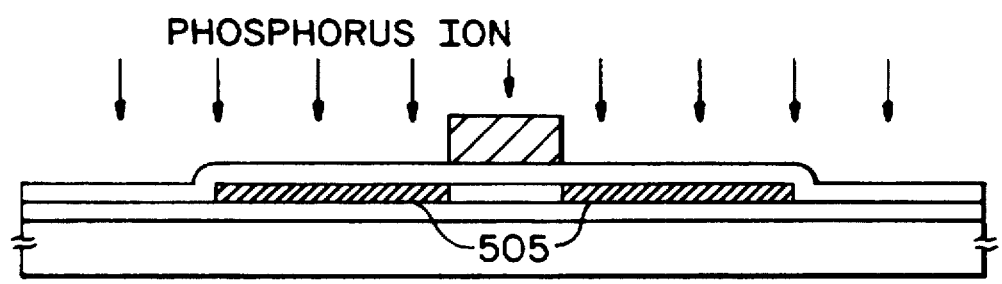
Figure 5D:
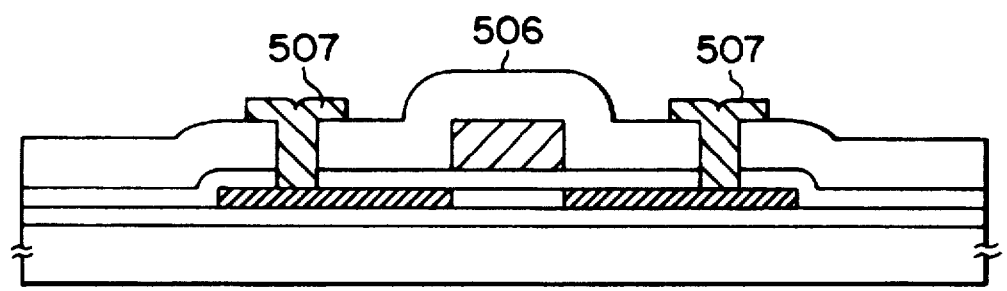

11: laser spot;
12: substrate;
31: vibration-proof base;
32: laser oscillator;
33: amplifier;
34: optics;
35, 36, 37, 38: totally reflecting mirrors;
39: mirror;
40: stage and driver for a specimen;
41: substrate;
42: vacuum vessel;
501: crystalline silicon film;
502: silicon film in the form of islands;
503: gate-insulating film;
504: gate electrodes;
505: N-type doped regions (source/drain regions);
506: interlayer insulating film;
507: source/drain electrodes

We claim:

1. A method of processing a semiconductor device with a laser comprising:

a first step of irradiating the device with laser light; and a second step, after the first step, of irradiating the device with laser light, wherein scanning direction of the laser light irradiated in the first step is substantially perpendicular to scanning direction of the laser light irradiated in the second step.

2. The method of claim 1 wherein said laser light irradiated in the first step and said laser light irradiated in the second step are linear laser lights.

3. The method of claim 1 wherein energy density of the laser light used in the second step is larger than that of the laser light used in the first step.

4. The method of claim 1 wherein energy density of the laser light used in the second step is 1.3 or more times as large as that of the laser light used in the first step.

5. The method of claim 1 wherein the first step is carried out under reduced pressure.

6. The method of claim 1 wherein the first and second steps are carried out at a temperature of from room temperature to 550° C.

7. The method of claim 1 wherein said second step is carried out in an oxygen ambient under reduced pressure.

8. A method of processing a semiconductor device with a laser comprising:

a first step of irradiating the device with laser light; and a second step, after the first step, of irradiating the device with laser light in an oxygen ambient or in air, wherein energy density of the laser light used in the second step is larger than that of the laser light used in the first step.

9. A method of processing, a semiconductor device with a laser as set forth in claim 8, wherein energy density of the laser light used in the second step is more than 1.3 times as large as energy density of the laser light used in the first step.

10. A method of pressing a semiconductor device with a laser as set forth in claim 8, wherein direction of the laser light irradiated in the first step is substantially perpendicular to direction of the laser light irradiated in the second step.

11. A method of processing a semiconductor device with a laser as set forth in claims 1 and 8, wherein a chamber used for the first step is different from a chamber used for the second step.

12. The method of claim 8 wherein the first step is carried out under reduced pressure.

13. The method of claim 8 wherein the first and second steps are carried out at a temperature of from room temperature to 550° C.

14. The method of claim 8 wherein said second step is carried out in an oxygen ambient under reduced pressure.

15. A method of processing a semiconductor device with a laser comprising:

a first step of irradiating the device with laser light; and a second step, after the first step, of irradiating the device with laser light in an oxygen ambient or in air, wherein scanning direction of the laser light irradiated in the first step is substantially perpendicular to scanning direction of the laser light irradiated in the second step.

16. The method of claim 15 wherein said laser light irradiated in the first step and said laser light irradiated in the second step are linear laser lights.

17. The method of claim 15 wherein the first step is carried out under reduced pressure.

18. The method of claim 15 wherein the first and second steps are carried out at a temperature of from room temperature to 550° C.

19. The method of claim 15 wherein said second step is carried out in an oxygen ambient under reduced pressure.

* * * * *